(12) United States Patent
Lee et al.

(10) Patent No.: US 7,733,010 B2
(45) Date of Patent: Jun. 8, 2010

(54) ORGANIC ELECTROLUMINESCENT DEVICE AND ITS METHOD OF MANUFACTURE

(75) Inventors: Sung-Hun Lee, Seoul (KR); Joon-Yong Park, Yongin-si (KR); Sang-Yeol Kim, Gwacheon-si (KR); Euk-Che Hwang, Osan-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 386 days.

(21) Appl. No.: 11/583,045

(22) Filed: Oct. 19, 2006

(65) Prior Publication Data

US 2007/0252518 A1     Nov. 1, 2007

(30) Foreign Application Priority Data

Apr. 28, 2006   (KR) ...................... 10-2006-0038880

(51) Int. Cl.
*H01L 51/50* (2006.01)
*H01L 51/52* (2006.01)
*H01L 51/56* (2006.01)

(52) U.S. Cl. ........................ 313/504; 313/503; 313/506; 427/66

(58) Field of Classification Search ......... 313/500–512; 445/24, 25; 427/66
See application file for complete search history.

(56) References Cited

U.S. PATENT DOCUMENTS

| 2001/0024083 A1* | 9/2001 | Yamazaki et al. ........... 313/483 |
| 2005/0014021 A1* | 1/2005 | Seki et al. .................. 313/504 |
| 2005/0118328 A1* | 6/2005 | Seki et al. .................... 427/66 |

* cited by examiner

*Primary Examiner*—Mariceli Santiago
(74) *Attorney, Agent, or Firm*—Richard E. Bushnell, Esq.

(57) ABSTRACT

An organic electroluminescent device includes: a substrate; a plurality of first electrodes arranged on the substrate; a plurality of banks arranged on the substrate and the first electrodes to define pixels on the first electrodes, the plurality of banks being of an inorganic material; a plurality of separators arranged in stripe shapes on the plurality of banks between the pixels, the plurality of separators being of an organic material; organic Emitting Material Layers (organic EMLs), each having a predetermined color, the organic EMLs being arranged within each of the pixels; and a plurality of second electrodes arranged on the organic EMLs, the plurality of banks, and the plurality of separators.

21 Claims, 6 Drawing Sheets

20R  20G  20B  15

20R  21  15  20G  12  15  20B  12

ORGANIC ELECTROLUMINESCENT DEVICE AND ITS METHOD OF MANUFACTURE

CLAIM OF PRIORITY

This application makes reference to, incorporates the same herein, and claims all benefits accruing under 35 U.S.C.§119 from an application for ORGANIC ELECTRO LUMINESCENCE DEVICE AND METHOD OF MANUFACTURING THE SAME earlier filed in the Korean Intellectual Property Office on the 28th of Apr. 2006 and there duly assigned Serial No. 10-2006-0038880.

BACKGROUND OF THE INVENTION

1. Field of the Invention

The present invention relates to an organic electroluminescent device and its method of manufacture, and more particularly, the present invention relates to an organic electroluminescent device that can prevent leakage current, short circuits, and color mixing between pixels and its method of manufacture.

2. Description of the Related Art

In general, organic electroluminescent devices are display devices that realize an image using light emitted by combining holes supplied from an anode electrode with electrons supplied from a cathode electrode in an organic emitting material layer formed between the anode electrode and the cathode electrode. Due to superior display characteristics such as wide viewing angle, rapid response time, low manufacturing costs, and high contrast, organic electroluminescent devices are expected to be the next generation of flat panel display devices.

Organic electroluminescent devices can be divided into Passive Matrix (PM) devices and Active Matrix (AM) devices. A PM organic electroluminescent device has a structure in which anode electrodes and cathode electrodes are arranged in a matrix, and an AM organic electroluminescent device has a structure in which an anode electrode, a plurality of Thin Film Transistors (TFTs), and capacitors are arranged in each pixel. Also, organic electroluminescent devices can be divided into top emission devices and bottom emission devices according to the direction of light emission from an organic emitting material layer.

FIG. 1 is a plan view of a PM organic electroluminescent device, and FIG. 2 is a cross-sectional view taken along the line II-II' of FIG. 1.

Referring to FIGS. 1 and 2, a plurality of anode electrodes 12 are formed in a stripe shape on a substrate 10. Banks 15 that define pixels by exposing predetermined regions of the anode electrodes 12 are also formed on the substrate 10. The banks 15 are usually formed of an organic material. In the pixels defined by the banks 15, Hole Transporting Layers (HTLs) 21 are formed to contact the anode electrodes 12, and organic Emitting Material Layers (EMLs), each emitting a predetermined color, for example, a red light emitting layer 20R, a green light emitting layer 20G, and a blue light emitting layer 20B, are formed on each upper surface of the HTLs 21. The organic EMLs having the same color are formed along the direction of the anode electrodes 12. The HTLs 21 and the organic EMLs 20R, 20G, and 20B can be formed using a spin coating method, a dispensing method, or an ink jet method. A plurality of cathode electrodes 32 are formed in stripe shapes on upper surfaces of the organic EMLs 20R, 20G, and 20B and the banks 15. The cathode electrodes 32 cross the anode electrodes 12.

However, in the organic electroluminescent device having the above structure, the banks 15 are formed of an organic material having a large contact angle with respect to materials which form the HTLs 21 and the organic EMLs 20R, 20G, and 20B, and thus, the HTLs 21 and the organic EMLs 20R, 20G, and 20B are thin at the edges of the pixels. Accordingly, when the cathode electrodes 32 contact the HTLs 21, a leakage current can occur. Furthermore, when the cathode electrodes 32 contact the anode electrodes 12, short circuits can occur. Also, when the HTLs 21 and the organic EMLs 20R, 20G, and 20B are formed using a dispensing method, a disconnection of the HTLs 21 or the organic EMLs 20R, 20G, and 20B can occur.

SUMMARY OF THE INVENTION

The present invention provides an organic electroluminescent device that can prevent leakage current, short circuits, and color mixing, and its method of manufacture.

According to one aspect of the present invention, an organic electroluminescent device is provided including: a substrate; a plurality of first electrodes arranged on the substrate;

a plurality of banks arranged on the substrate and the first electrodes to define pixels on the first electrodes, the plurality of banks being of an inorganic material; a plurality of separators arranged in stripe shapes on the plurality of banks between the pixels, the plurality of separators being of an organic material; organic Emitting Material Layers (organic EMLs), each having a predetermined color, the organic EMLs being arranged within each of the pixels; and a plurality of second electrodes arranged on the organic EMLs, the plurality of banks, and the plurality of separators.

The plurality of separators are preferably formed between the pixels in which organic EMLs having different colors from each other are formed to prevent color mixing between the pixels.

The organic electroluminescent device preferably further includes Hole Transport Layers (HTLs) arranged between the organic EMLs and the first electrodes.

The first electrodes are preferably arranged in stripe shapes and the second electrodes are preferably arranged in stripe shapes crossing the first electrodes. The first electrodes are preferably arranged parallel to the plurality of separators and the second electrodes preferably perpendicularly cross the plurality of separators. The first electrodes are preferably arranged corresponding to each of the pixels.

The second electrodes are preferably arranged as common electrodes covering entire surfaces of the organic EMLs, the plurality of banks, and the plurality of separators.

The substrate preferably includes either a glass substrate or a plastic substrate.

The first and second electrodes preferably include either a transparent conductive material or a metal.

According to another aspect of the present invention, a method of manufacturing an organic electroluminescent device is provided, the method including: forming a plurality of first electrodes on a substrate; defining pixels on the first electrodes by forming a plurality of banks on the substrate and the first electrodes, the plurality of banks being of an inorganic material; forming a plurality of separators in stripe shapes on the plurality of banks between the pixels, the plurality of separators being an organic material; forming organic Emitting Material Layers (organic EMLs), each having a predetermined color in each of the pixels; and forming a plurality of second electrodes on the organic EMLs, the plurality of banks, and the plurality of separators.

The plurality of separators are preferably formed between the pixels in which organic EMLs having different colors from each other are formed.

The plurality of banks are preferably formed by patterning a predetermined inorganic material layer to a predetermined shape to define the pixels that expose predetermined regions on the first electrodes after coating the predetermined inorganic material layer covering the substrate and the first electrodes.

The plurality of separators are preferably formed by patterning a predetermined organic material layer to stripe shapes after forming the predetermined organic material layer covering the plurality of banks and the pixels.

The method preferably further includes modifying surfaces of the plurality of banks and the plurality of separators after the plurality of banks and the plurality of separators are formed.

The organic EMLs are preferably formed by drying and baking liquid phase organic materials having predetermined colors after the liquid phase organic materials have been respectively arranged within the pixels.

The liquid phase organic materials are preferably arranged within the pixels using one of a spin coating method, a dispensing method, or an inkjet method.

The method preferably further includes forming Hole Transport Layers (HTLs) on bottoms of the pixels before forming the organic EMLs. The HTLs are preferably formed by drying and baking a liquid phase hole transport material after the liquid phase hole transport material has been arranged within the pixels. The liquid phase hole transport material is preferably arranged within the pixels using one of a spin coating method, a dispensing method, or an inkjet method.

The first electrodes are preferably formed in stripe shapes and the second electrodes are formed in stripe shapes crossing the first electrodes. The first electrodes are preferably formed parallel to the plurality of separators and the second electrodes are preferably formed to perpendicularly cross the plurality of separators. The first electrodes are preferably formed to correspond to each of the pixels.

The second electrodes are preferably formed as common electrodes covering entire surfaces of the organic EMLs, the plurality of banks, and the plurality of separators.

The substrate preferably includes either a glass substrate or a plastic substrate.

The first and second electrodes preferably include either a transparent conductive material or a metal.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
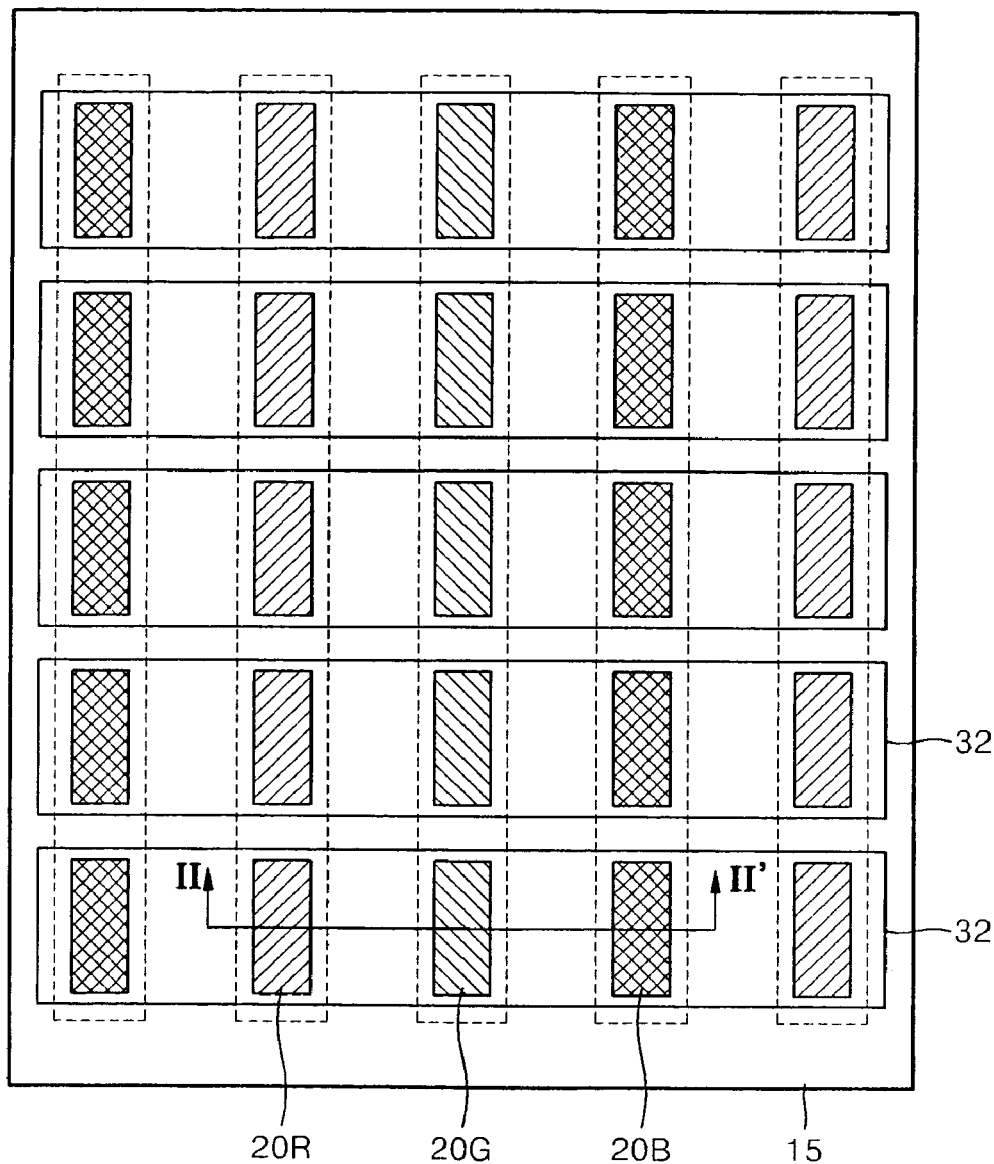
FIG. 1 is a plan view of an organic electroluminescent device.
Figure 2:
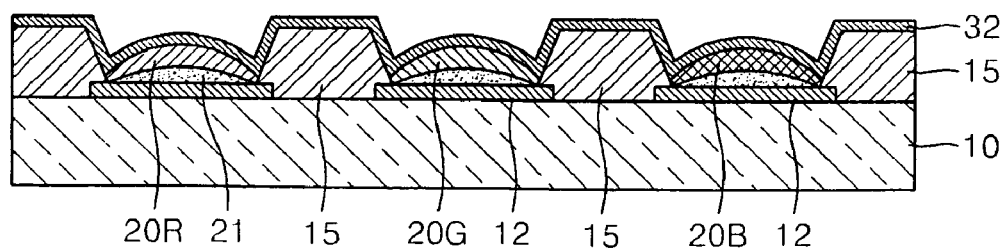
FIG. 2 is a cross-sectional view taken along the line II-II' of FIG. 1.

The present invention is described more fully below with reference to the accompanying drawings in which exemplary embodiments of the present invention are shown. In the drawings, like reference numerals refer to the like elements and the thicknesses of layers and regions have been exaggerated for clarity.

Figure 3:
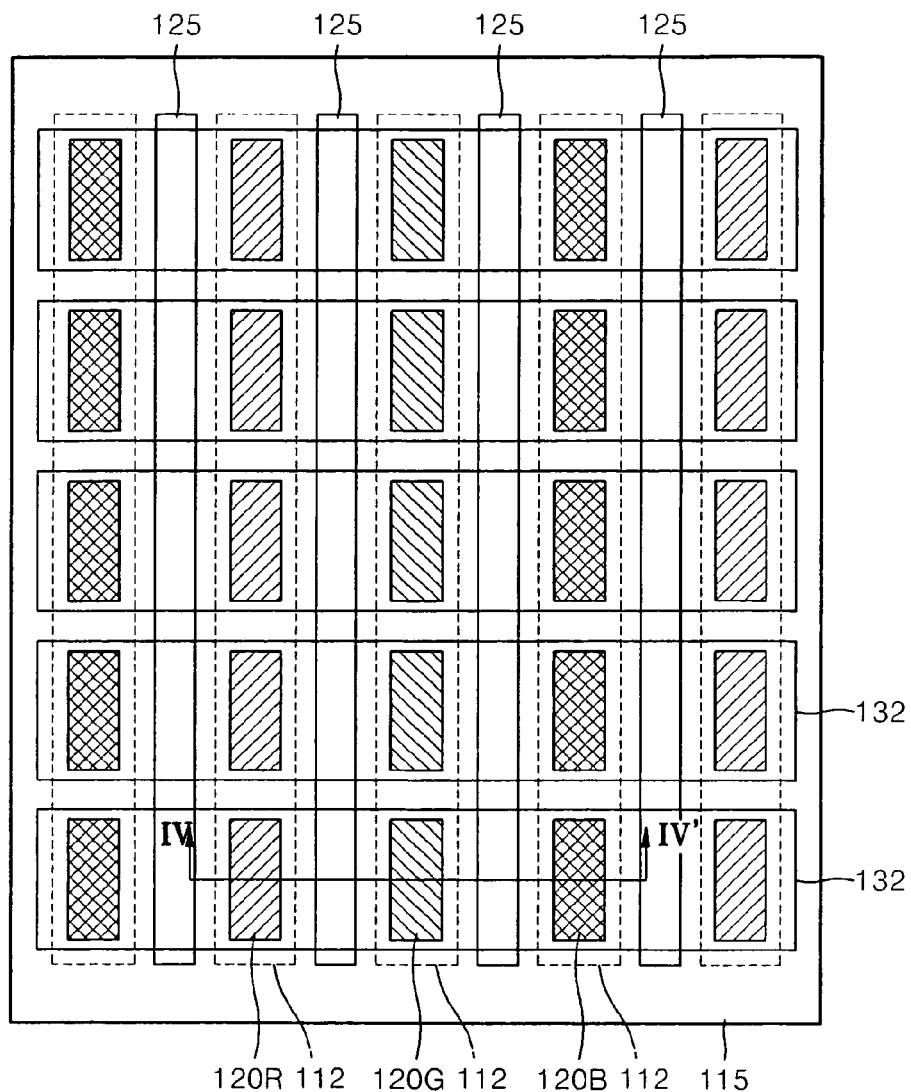
FIG. 3 is a plan view of an organic electroluminescent device according to an embodiment of the present invention.
Figure 4:
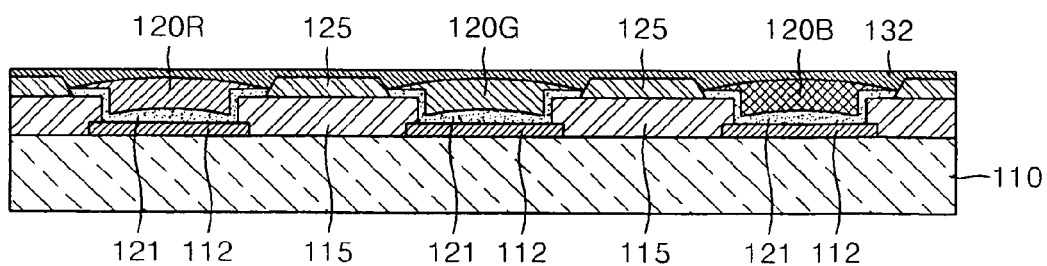
FIG. 4 is a cross-sectional view taken along the line IV-IV' of FIG. 3.
Figure 5:
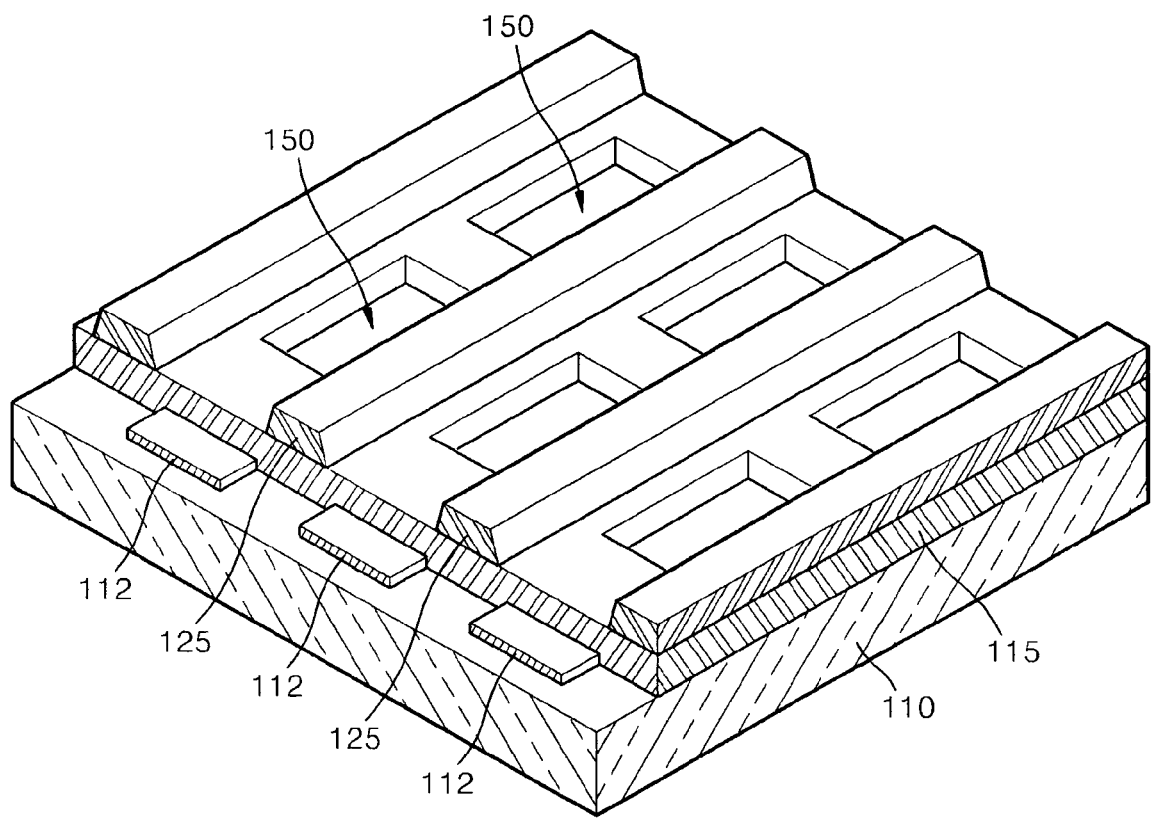
FIG. 5 is a perspective view of banks and separators of an organic electroluminescent device according to an embodiment of the present invention.

FIG. 3 is a plan view of an organic electroluminescent device according to an embodiment of the present invention, FIG. 4 is a cross-sectional view taken along the line IV-IV' of FIG. 3. FIG. 5 is a perspective view of banks and separators of an organic electroluminescent device according to an embodiment of the present invention.

Referring to FIGS. 3 through 5, a plurality of first electrodes 112 are formed in stripe shapes on a substrate 110. The substrate 110 can be usually a glass substrate or a plastic substrate. The first electrodes 112 can be anode electrodes. In a bottom emission organic electroluminescent device, the first electrodes 112 can be a transparent electrode formed of a transparent material such as Indium Tin Oxide (ITO). In a top emission organic electroluminescent device, the first electrodes 112 can be a reflective electrode formed of a metal.

Banks 115 that expose a predetermined region of the first electrodes 112 are formed to a predetermined thickness on the substrate 110 on which the first electrodes 112 are formed. Pixels 150 on the first electrodes 112 are defined by the banks 115. In the present embodiment, the banks 115 are formed of an inorganic material. The banks 115 formed of an inorganic material have a small contact angle with respect to a hole transport material 121' (see FIG. 9) which will be described later. Therefore, when Hole Transport Layers (HTLs) 121 (see FIG. 10) are formed using, for example, a dispensing method, the HTLs 121 can be formed to a uniform thickness in the pixel 150 without disconnections. In FIG. 5, the pixels 150 defined by the banks 115 are formed in a rectangular shape. However, the pixels 150 can have various shapes besides the rectangular shape.

A plurality of separators 125 having stripe shapes parallel to the first electrodes 112 are formed on the banks 115. The separators 125 are disposed between pixels 150 in which organic Emitting Material Layers (EMLs) 120R, 120G, and 120B having different colors from each other are formed so that color mixing between pixels 150 cannot occur. Also, in the present embodiment, the separators 125 are formed of an organic material. When the separators 125 are formed of an organic material, the flow of the hole transport material 121' (see FIG. 9) and the organic emitting materials 120'R, 120'G, and 120'B over the separators 125 can be prevented since the separators 125 formed of an organic material have a large contact angle with respect to the hole transport material 121' (see FIG. 9) and the organic emitting materials 120'R, 120'G, and 120'B, thereby effectively preventing color mixing between the pixels 150. Surfaces of the banks 115 and the separators 125 can be modified to obtain desired contact angles by a method of surface treating.

HTLs 121 can be formed under the pixels 150 defined by the banks 115. The HTLs 121 are formed to contact the first electrodes 112 exposed through the pixels 150. The HTLs 121 can be formed by drying and baking a liquid phase hole transport material 121' (see FIG. 9) after the liquid phase hole transport material 121' (see FIG. 9) is formed in the pixels 150 using a spin coating method, a dispensing method, or an inkjet method. The HTLs 121 can be uniformly formed in the pixels 150 since surfaces of the banks 115 that contact the liquid phase hole transport material 121' have a small contact angle.

Organic EMLs, each having a predetermined color, for example, a red light emitting layer 120R, a green light emitting layer 120G, and a blue light emitting layer 120B, are formed on upper surfaces of the HTLs 121. The organic EMLs 120R, 120G, and 120B having the same color are formed in a direction of the first electrodes 112, that is, parallel to the separators 125. The organic EMLs 120R, 120G, and 120B can be formed by drying and baking liquid phase organic emitting materials 120R', 120G', and 120B' (see FIG. 11) after the liquid phase hole transport material 121' (see FIG. 11) has been formed on the upper surfaces of the HTLs 121 using a spin coating method, a dispensing method, or an inkjet method. The flow of the organic emitting materials 120'R, 120'G, and 120'B into the pixels 150 over the separators 125 can be prevented since surfaces of the separators 125 that contact the liquid phase organic emitting materials 120'R, 120'G, and 120'B have a large contact angle, and accordingly, the organic EMLs 120R, 120G, and 120B covering the HTLs 121 can be formed to a uniform thickness.

A plurality of second electrodes 132 are formed in stripe shapes on upper surfaces of the organic EMLs 120R, 120G, and 120B and the separators 125. The second electrodes 132 can be cathode electrodes and can cross the first electrodes 112 and the separators 125. In a bottom organic electroluminescent device, the second electrodes 132 can be reflective electrodes formed of a metal. In a top organic electroluminescent device, the second electrodes 132 can be transparent electrodes formed of a transparent conductive material formed in a monolayer or multilayer.

As described above, in the present embodiment, the HTLs 121 can be formed to a uniform thickness by forming the separators 125, which are formed of an organic material, on the banks 115, which are formed of an inorganic material, and can prevent color mixing between pixels 150. Also, current leakages or short circuits can be prevented since the second electrodes 132 do not contact the HTLs 121 or the first electrodes 112.

In the above embodiment, a PM organic electroluminescent device in which the first electrodes 112 which are anode electrodes cross the second electrodes 132 which are cathode electrodes has been described, but the present invention is not limited thereto and can be applied to an AM organic electroluminescent device. That is, in the AM organic electroluminescent device, first electrodes (not shown) which are anode electrodes are formed in predetermined shapes corresponding to each of the pixels 150, and a plurality of driving transistors and capacitors (not shown) are connected to the respective first electrodes. The second electrodes 132 which are cathode electrodes can be formed in a common electrode shape covering upper surfaces of the organic EMLs 120R, 120G, and 120B and the separators 125.

A method of manufacturing an organic electroluminescent device according to an embodiment of the present invention is described as follows. FIGS. 6 through 13 are cross-sectional views of a method of manufacturing an organic electroluminescent device according to an embodiment of the present invention.

Figure 6:
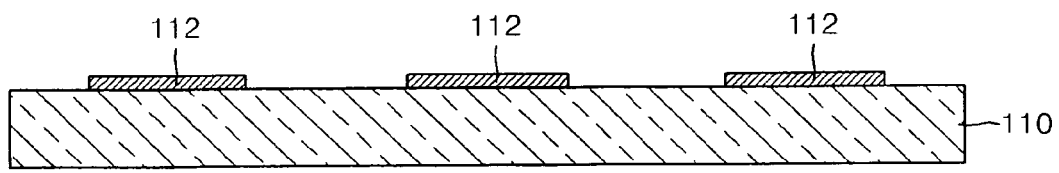
FIGS. 6 through 13 are cross-sectional views of a method of manufacturing an organic electroluminescent device according to an embodiment of the present invention.

Referring to FIG. 6, a plurality of first electrodes 112 are formed on a substrate 110. The substrate 110 can be a glass substrate or a plastic substrate. The first electrodes 112 can be anode electrodes. The first electrodes 112 can be formed by patterning a predetermined conductive material layer deposited on the substrate 110. The first electrodes 112 can be transparent electrodes formed of a transparent material such as Indium Tin Oxide (ITO) in a bottom organic electroluminescent device, or can be reflective electrodes formed of a metal in a top organic electroluminescent device. In a PM organic electroluminescent device, the first electrodes 112 can be formed in stripe shapes parallel to each other. In an AM organic electroluminescent device, the first electrodes 112 can be formed to a predetermined shape corresponding to each of the pixels 150.

Figure 7:
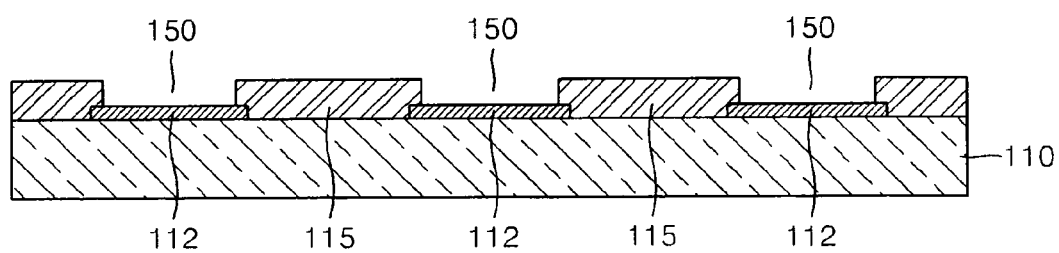

Referring to FIG. 7, banks 115 that define the pixels 150 are formed to a predetermined thickness on the substrate 110 on which the first electrodes 112 are formed. More specifically, the banks 115 can be formed by patterning a predetermined inorganic material layer after the predetermined inorganic material is coated on the substrate 110 on which the first electrodes 112 are formed. Accordingly, the pixels 150 that expose predetermined regions of the first electrodes 112 are formed in the banks 115.

Figure 8:
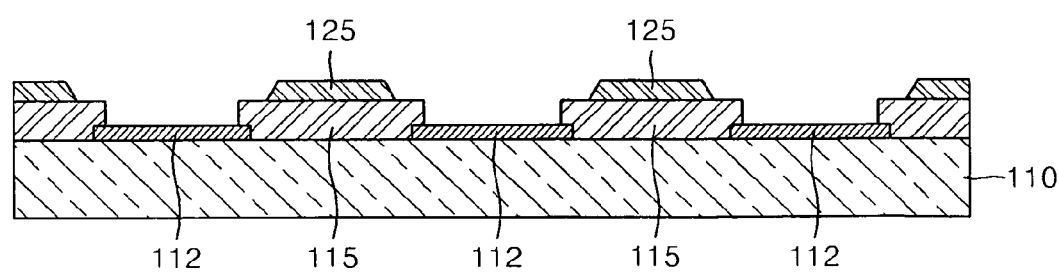

Referring to FIG. 8, a plurality of separators 125 are formed in stripe shapes on the banks 115 between the pixels 150. More specifically, the separators 125 can be formed by patterning a predetermined organic material after the predetermined organic material is coated to cover the first electrodes 112 exposed through the pixels 150 and the banks 115. In a PM organic electroluminescent device, the separators 125 can be formed parallel to the first electrodes 112. After the banks 115 and the separators 125 are formed, surfaces of the banks 115 and the separators 125 can be modified by a surface treating method so that the banks 115 and the separators 125 can have a desired contact angle with respect to a hole transport material 121' (see FIG. 9) and organic emitting materials 120'R, 120'G, and 120'B which will be described later.

Figure 9:
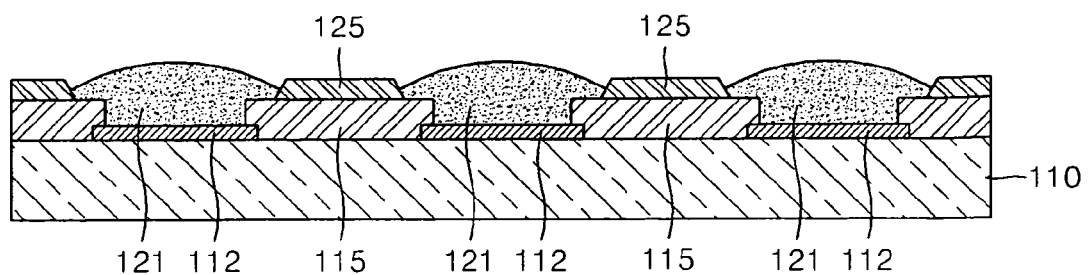
Figure 10:
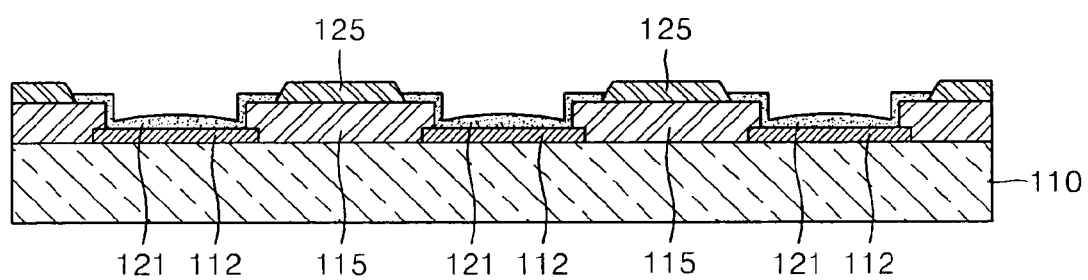

Referring to FIG. 9, a liquid phase hole transport material 121' is filled into the pixels 150 on the first electrodes 112 defined by the banks 115. The hole transport material 121' can be formed in the pixels 150 using a spin coating method, a dispensing method, or an inkjet method. In the present embodiment, the banks 115 are formed of an inorganic material having a small contact angle with respect to the hole transport material 121'. Therefore, the hole transport material 121' can be formed to cover surfaces of the banks 115 located on edges of the pixels 150. After the hole transport material 121' filled into the pixels 150 is dried and baked, Hole Transporting Layers (HTLs) 121 having a uniform thickness can be formed on lower parts of the pixels 150. Referring to FIG. 10, the HTLs 121 can be formed to a uniform thickness on surfaces of the banks 115 located on edges of the pixels 150.

Figure 11:
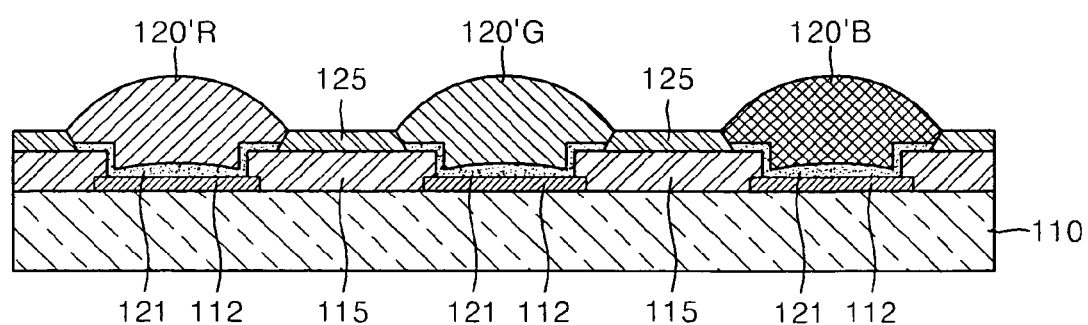
Figure 12:
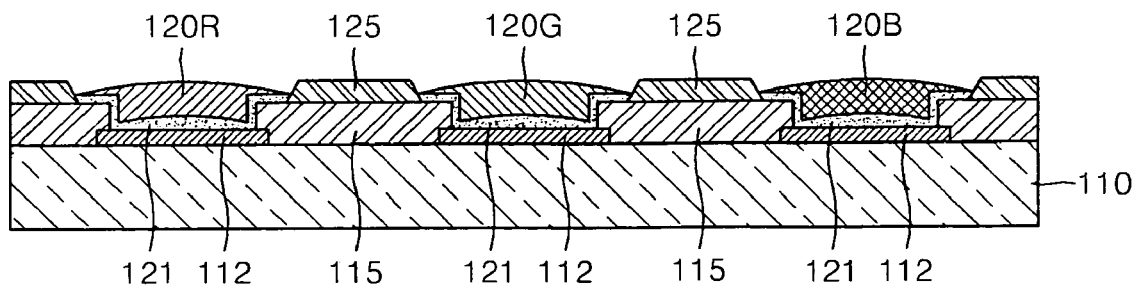
Figure 13:
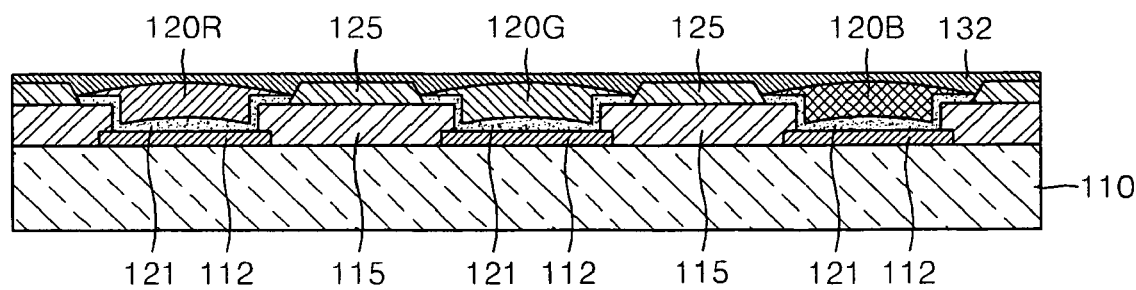

Referring to FIG. 11, liquid phase organic emitting materials respectively having a predetermined color, for example, a red light emitting material 120'R, a green light emitting material 120'G, and a blue light emitting material 120'B, are sequentially filled into each of the pixels 150 where the HTLs 121 are formed. The liquid phase organic emitting materials 120'R, 120'G, and 120'B can be formed in the pixels 150 using a spin coating method, a dispensing method, or an inkjet method. The organic emitting materials 120'R, 120'G, and 120'B are respectively formed in a direction parallel to the separators 125. Accordingly, the separators 125 are located on banks 115 between the pixels 150 filled with organic emitting materials 120'R, 120'G, and 120'B which are different from each other. In the present embodiment, the separators 125 are formed of an organic material having a large contact angle with respect to the organic emitting materials 120'R, 120'G, and 120'B. Therefore, the flow of the organic emitting materials 120'R, 120'G, and 120'B into the pixels 150 over the separators 125 can be prevented during the process of filling the organic emitting materials 120'R, 120'G, and 120'B into the pixels 150. After the organic emitting materials 120'R, 120'G, and 120'B filled into the pixels 150 are dried and baked, organic emitting material layers, each having a predetermined color, for example, a red light emitting layer 120R, a green light emitting layer 120G, and a blue light emitting layer 120B, covering the HTLs 121 in the pixels 150 can be formed to a uniform thickness.

Finally, when a plurality of second electrodes 132 are formed on the organic EMLs 120R, 120G, and 120B, the banks 115, and the separators 125, the manufacture of an organic electroluminescent device according to an embodiment of the present invention has been completed. The second electrodes 132 can be cathode electrodes. The second electrodes 132 can be formed by depositing a predetermined conductive material on the organic emitting material layers 120R, 120G, and 120B, the banks 115, and the separators 125 using an electrode separator or a shadow mask. In a bottom organic electroluminescent device, the second electrodes 132 can be reflective electrodes formed of a metal, and in a top organic electroluminescent device, the second electrodes 132 can be transparent electrodes formed of a transparent conductive material formed in a monolayer or a multilayer. In a PM organic electroluminescent device, the second electrodes 132 can be formed in stripe shapes perpendicularly crossing the first electrodes 112 and the separators 125. In an AM organic electroluminescent device, the second electrodes 132 can be formed as common electrodes covering entire surfaces of the organic emitting materials 120'R, 120'G, and 120'B, banks 115, and the separators 125.

As described above, according to the present invention, HTLs and organic EMLs can be formed to a uniform thickness without disconnections by forming separators in stripe shapes using an organic material on banks formed of an inorganic material. Also, the separators can prevent the mixing of organic emitting materials between adjacent pixels, the organic emitting materials having different colors from each other. Also, there is no possibility of causing a leakage current since cathode electrodes are separated from HTLs and anode electrodes.

While the present invention has been particularly shown and described with reference to exemplary embodiments thereof, it will be understood by those of ordinary skill in the art that various modifications in form and detail can be made therein without departing from the spirit and scope of the present invention as defined by the following claims.

What is claimed is:

1. An organic electroluminescent device, comprising:
   a substrate;
   a plurality of first electrodes arranged on the substrate;
   a plurality of banks arranged on the substrate and the first electrodes to define pixels on the first electrodes, the plurality of banks being of an inorganic material;
   a plurality of separators arranged in stripe shapes on the plurality of banks between the pixels, the plurality of separators being of an organic material;
   organic Emitting Material Layers (organic EMLs), each having a predetermined color, the organic EMLs being arranged within each of the pixels; and
   a plurality of second electrodes arranged on the organic EMLs, the plurality of banks, and the plurality of separators,
   wherein the plurality of separators are formed between the pixels in which organic EMLs having different colors from each other,
   wherein the organic EMLs have an upper convex shaped surface in contact with the plurality of second electrodes and a lower concave shaped surface in contact with hole transport layers.

2. The organic electroluminescent device of claim 1, further comprising Hole Transport Layers (HTLs) arranged between the organic EMLs and the first electrodes.

3. The organic electroluminescent device of claim 1, wherein the first electrodes are arranged in stripe shapes and the second electrodes are arranged in stripe shapes crossing the first electrodes.

4. The organic electroluminescent device of claim 3, wherein the first electrodes are arranged parallel to the plurality of separators and wherein the second electrodes perpendicularly cross the plurality of separators.

5. The organic electroluminescent device of claim 1, wherein the first electrodes are arranged corresponding to each of the pixels.

6. The organic electroluminescent device of claim 5, wherein the second electrodes are arranged as common electrodes covering entire surfaces of the organic EMLs, the plurality of banks, and the plurality of separators.

7. The organic electroluminescent device of claim 1, wherein the substrate comprises either a glass substrate or a plastic substrate.

8. The organic electroluminescent device of claim 1, wherein the first and second electrodes comprise either a transparent conductive material or a metal.

9. A method of manufacturing an organic electroluminescent device, the method comprising:
   forming a plurality of first electrodes on a substrate;
   defining pixels on the first electrodes by forming a plurality of banks on the substrate and the first electrodes, the plurality of banks being of an inorganic material;
   forming a plurality of separators in stripe shapes on the plurality of banks between the pixels, the plurality of separators being an organic material;
   forming organic Emitting Material Layers (organic EMLs), each having a predetermined color in each of the pixels; and
   forming a plurality of second electrodes on the organic EMLs, the plurality of banks, and the plurality of separators,
   wherein the plurality of separators are formed between the pixels in which organic EMLs having different colors from each other are formed,
   wherein the organic EMLs are formed by drying and baking liquid phase organic materials having predetermined colors after the liquid phase organic materials have been respectively arranged within the pixels,
   wherein the liquid phase organic materials are arranged within the pixels using a dispensing method,
   wherein the onganic EMLs have an upper convex shaped surface in contact with the plurality of second electrodes and a lower concave shaped surface in contact with hole transport layers.

10. The method of claim 9, wherein the plurality of banks are formed by patterning a predetermined inorganic material layer to a predetermined shape to define the pixels that expose predetermined regions on the first electrodes after coating the predetermined inorganic material layer covering the substrate and the first electrodes.

11. The method of claim 9, wherein the plurality of separators are formed by patterning a predetermined organic material layer to stripe shapes after forming the predetermined organic material layer covering the plurality of banks and the pixels.

12. The method of claim 9, further comprising modifying surfaces of the plurality of banks and the plurality of separators after the plurality of banks and the plurality of separators are formed by a method of surface treating.

13. The method of claim 9, further comprising forming Hole Transport Layers (HTLs) on bottoms of the pixels before forming the organic EMLs.

14. The method of claim 13, wherein the HTLs are formed by drying and baking a liquid phase hole transport material after the liquid phase hole transport material has been arranged within the pixels.

15. The method of claim 14, wherein the liquid phase hole transport material is arranged within the pixels using a dispensing method.

16. The method of claim 9, wherein the first electrodes are formed in stripe shapes and the second electrodes are formed in stripe shapes crossing the first electrodes.

17. The method of claim 16, wherein the first electrodes are formed parallel to the plurality of separators and the second electrodes are formed to perpendicularly cross the plurality of separators.

18. The method of claim 9, wherein the first electrodes are formed to correspond to each of the pixels.

19. The method of claim 18, wherein the second electrodes are formed as common electrodes covering entire surfaces of the organic EMLs, the plurality of banks, and the plurality of separators.

20. The method of claim 9, wherein the substrate comprises either a glass substrate or a plastic substrate.

21. The method of claim 9, wherein the first and second electrodes comprise either a transparent conductive material or a metal.

* * * * *